United States Patent [19]
Yamaguchi

[11] Patent Number: 5,439,523
[45] Date of Patent: Aug. 8, 1995

[54] DEVICE FOR SUPPRESSING PARTICLE SPLASH ONTO A SEMICONDUCTOR WAFER

[75] Inventor: Akira Yamaguchi, Utsunomiya, Japan

[73] Assignee: MEMC Electronic Materials, Inc., St. Louis, Mo.

[21] Appl. No.: 195,766

[22] Filed: Feb. 14, 1994

[51] Int. Cl.⁶ .................... B05C 13/00; C23C 16/00
[52] U.S. Cl. .................... 118/503; 118/500; 118/715; 118/728; 118/729; 294/16
[58] Field of Search ............ 118/726, 715, 728, 500, 118/503, 504, 505, 729; 294/16, 28, 64.3

[56] References Cited

U.S. PATENT DOCUMENTS

| | | | |
|---|---|---|---|
| 4,561,486 | 12/1985 | Maeda | 164/118 |
| 4,595,222 | 6/1986 | Schumacher | 294/16 |
| 4,798,165 | 1/1989 | de Boar | 118/715 |
| 4,825,809 | 5/1989 | Mieno | 118/715 |
| 5,110,167 | 5/1992 | Friend | 294/16 |
| 5,134,963 | 8/1992 | Barbee | 118/715 |
| 5,169,196 | 12/1992 | Safabakhsh | 294/64.3 |
| 5,224,504 | 7/1993 | Thompson | 134/155 |
| 5,237,756 | 8/1993 | Hurwitt | 34/15 |
| 5,241,758 | 9/1993 | Cruz | 34/22 |
| 5,261,960 | 11/1993 | Ozias | 118/719 |
| 5,269,847 | 12/1993 | Anderson | 118/715 |
| 5,298,720 | 3/1994 | Cuomo | 219/121.43 |

FOREIGN PATENT DOCUMENTS

| | | | |
|---|---|---|---|
| 3264637 | 11/1990 | Japan | 118/715 |
| 3151629 | 6/1991 | Japan | 118/723 E |
| 3196615 | 8/1991 | Japan | 118/723 E |

Primary Examiner—R. Bruce Breneman
Assistant Examiner—Jeffrie R. Lund
Attorney, Agent, or Firm—Senniger, Powers, Leavitt & Roedel

[57] ABSTRACT

A device for suppressing the splash of particles onto a semiconductor wafer, such as occurs in association with deposition of epitaxial layers on the wafer, to facilitate maintenance of a clean wafer surface and inhibit the creation of defects, includes a mechanism for deflecting the path of the particles away from the wafer. The mechanism may include nozzles for directing a flow of gas toward the site on the wafer where particle generation occurs, and a vacuum for drawing the particles away from the site.

25 Claims, 2 Drawing Sheets

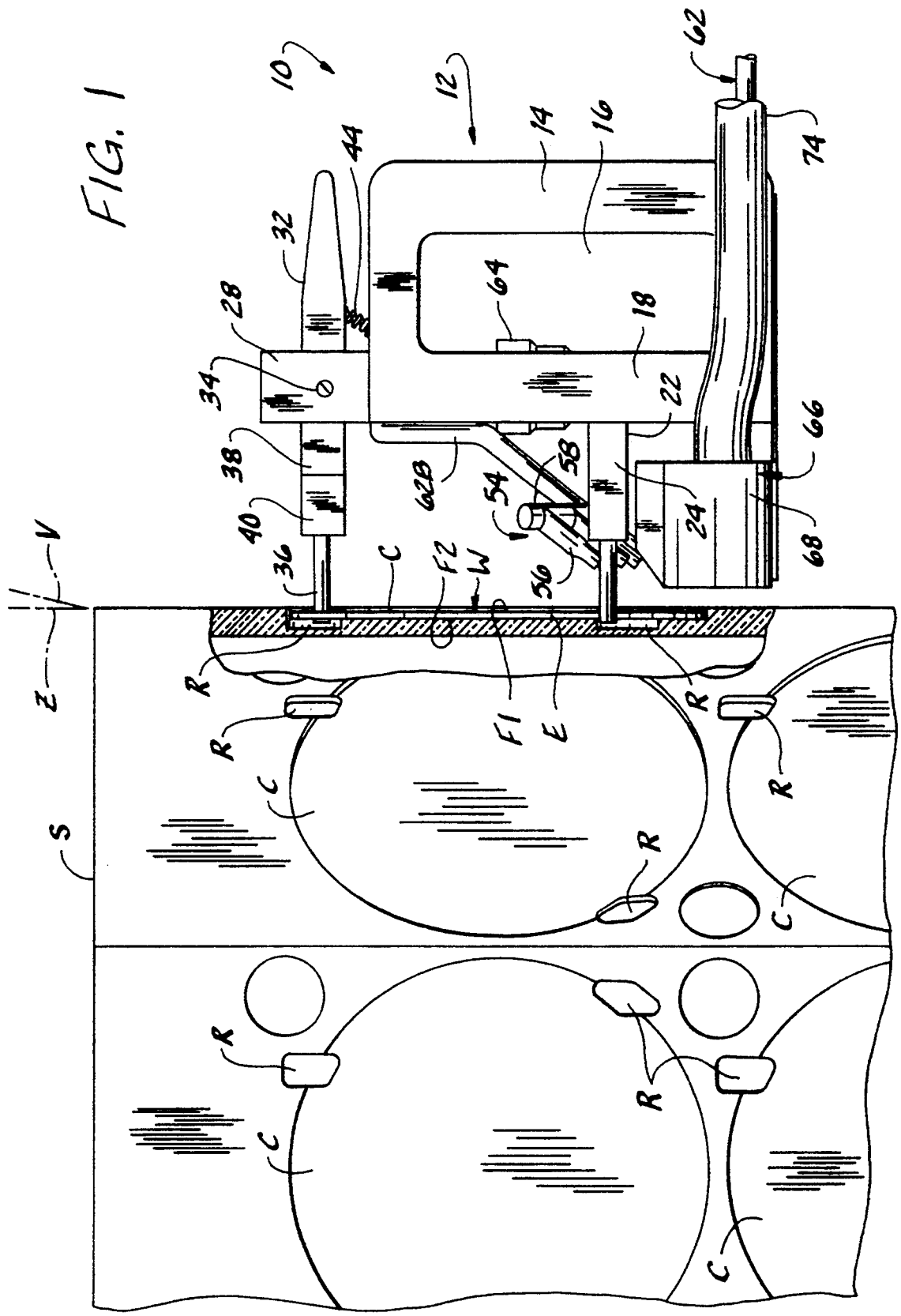

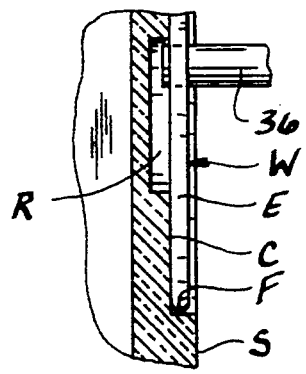
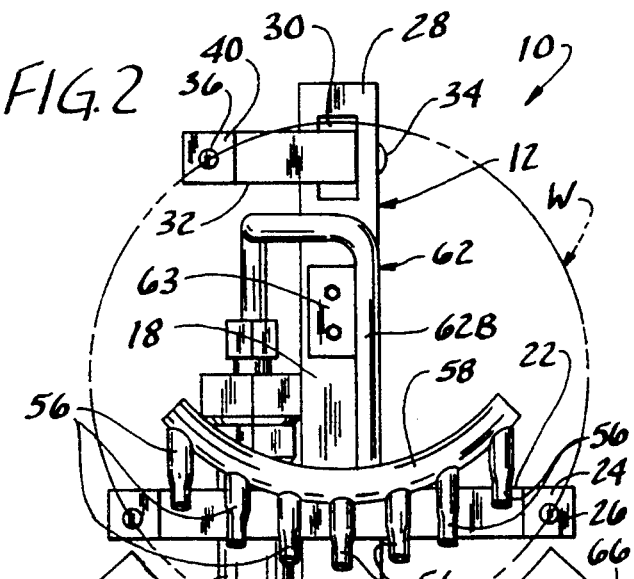
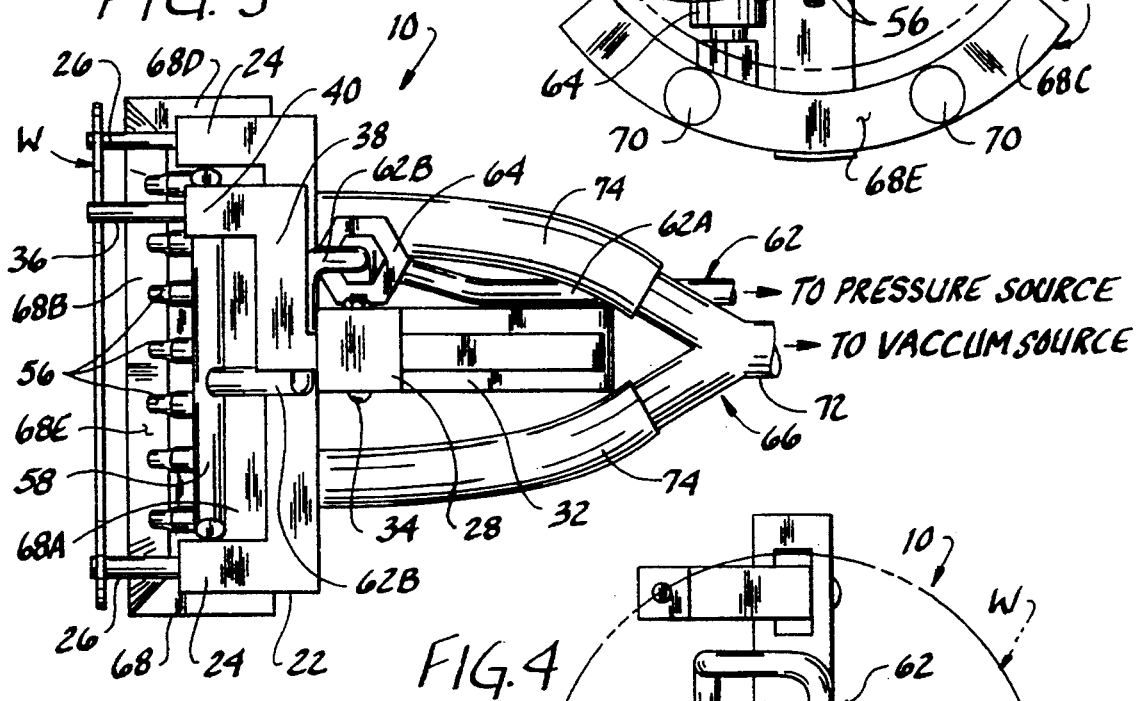
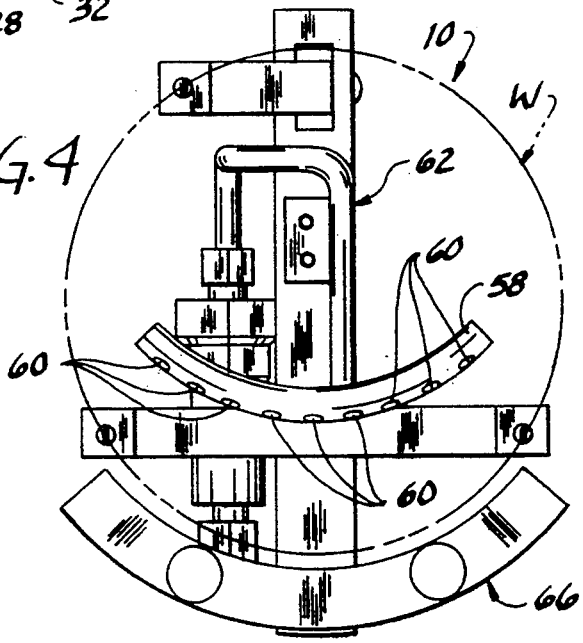
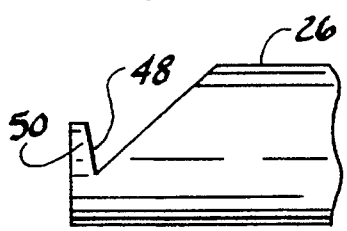

DEVICE FOR SUPPRESSING PARTICLE SPLASH ONTO A SEMICONDUCTOR WAFER

BACKGROUND OF THE INVENTION

This invention relates generally to devices for handling materials without contamination of the materials, and more particularly to a device which suppresses splashing of particles onto a semiconductor wafer.

The production of high quality semiconductor wafers requires the maintenance of clean wafer surfaces during processing. In particular, the avoidance of defects during the deposition of a monocrystalline (i.e., epitaxial) layer on a surface of the wafer requires the virtual absence of particles on the surface of the wafer. During the epitaxial layer deposition process, the wafer is held in the reaction chamber in a wafer pocket or compartment on a susceptor with one face directed outwardly of the compartment on which the epitaxial layer is to be deposited.

Occasionally, when the wafer is placed in the susceptor compartment, the impact of the wafer against the floor of the compartment is sufficient to cause disintegration of a layer of the semiconductor material on the susceptor around the point of contact left from a previous deposition process. Particles can also be generated when the wafer is removed from the compartment and a bridge of deposited semiconductor material between the wafer and the susceptor at the contact point is broken. Particles generated can be splashed onto the outwardly directed wafer face resulting in epitaxial defects such as hillocks, ESF's and spikes. The existence of these defects (often referred to as "light point defects" because of the procedure used to test for the defects) can greatly reduce the quality of the wafer, affecting the yield of wafers produced which meet specification. It is believed that splashing occurs as a result of the kinetic energy of the particles after they are broken away, the ascending flow of gas around the susceptor and over the outwardly directed face of the wafer, and/or the presence of a static charge which attracts the particles to the face of the wafer.

Prior efforts to reduce light point defects have not adequately remedied the problem. Training of the operator can result in a reduction of particle generation, but does not assure consistency of result, as significant particle generation may occur notwithstanding the skill of the operator. Many of the particles generated as described above are sufficiently large to survive acid gas (HCl) etching applied to the wafers just before the deposition of the epitaxial layer occurs. Different geometries of the wafer compartment in the susceptor and frequent etch back of semiconductor material deposited on the susceptor have also not been completely successful.

SUMMARY OF THE INVENTION

Among the several objects and features of the present invention may be noted the provision of a device which suppresses the splashing of particles onto a semiconductor wafer; the provision of such a device which deflects particles from the wafer without subjecting the wafer to contamination from the deflection mechanism; the provision of such a device which removes particles from the area of the wafer; the provision of such a device which grips the wafer in such a way as to minimize the opportunity for contamination of the wafer by engagement with the device; and the provision of such a device which is easy to use.

Further among the several objects and features of the present invention may be noted the provision of a method for suppressing splashing of particles onto the wafer.

Generally, a device for suppressing the splash of particles onto a semiconductor wafer to facilitate maintenance of a clean wafer surface and inhibit the creation of defects, comprises means for deflecting the path of the particles away from the wafer and means for orienting the deflecting means relative to the wafer.

In another aspect of the present invention, a method for suppressing particles from becoming deposited on a face of a semiconductor wafer where they may become the site of a defect includes the step of providing means for deflecting particles from the wafer. The deflecting means is oriented generally adjacent to a portion of the semiconductor wafer where substantial particle generation occurs, and then activated to deflect particles from a path which would cause them to be deposited on the wafer.

Other objects and features of the present invention will be in part apparent and in part pointed out hereinafter.

BRIEF DESCRIPTION OF THE DRAWINGS

FIG. 1 is an elevation of a device for suppressing splash of particles onto a semiconductor wafer and a fragmentary portion of a susceptor showing the device positioned for deflecting particles from the lower peripheral edge of the wafer;

FIG. 1A is an enlarged fragmentary portion of the susceptor of FIG. 1 showing the engagement of the semiconductor wafer with susceptor;

FIG. 2 is a front elevation of the device;

FIG. 3 is a top plan of the device;

FIG. 4 is a front elevation of a device of a second embodiment; and

FIG. 5 is an enlarged fragmentary elevation of a finger of the device for use in gripping the wafer.

Corresponding reference characters indicate corresponding parts throughout the several views of the drawings.

DETAILED DESCRIPTION OF THE PREFERRED EMBODIMENTS

Referring now to the drawings, a device for suppressing splash of particles onto a semiconductor wafer W is shown in the form of a wafer grip (designated generally by the reference numeral 10) used to transport the wafer to and from a susceptor S which holds the wafer during deposition of an epitaxial layer on an outwardly directed face of the wafer. Although the device is shown in its preferred embodiment with structure for gripping the wafer, it is envisioned that the features of the invention which suppress the splash of particles (described below) could be separated from those features which grip the wafer and still fall within the scope of the present invention. Moreover, the device may be used for suppressing splash of particles in contexts other than epitaxial layer deposition when the maintenance of substantially particle-free surfaces on the wafer are required, and still fall within the scope of the present invention.

The wafer grip 10 includes a handle, indicated generally at 12, having a hand grip portion 14 and an opening 16 through which the fingers of one hand of an operator (not shown) may be received for holding the wafer grip. In the illustrated embodiment, a wafer W of the type which the wafer grip 10 is constructed for handling is made of a semiconductor material, such as silicon or gallium arsenide, and is generally circular in shape. The wafer W has broad, flat opposite faces (designated F1 and F2, respectively) and a thin, generally outwardly facing peripheral edge E. In practice, the peripheral edge E is rounded. A base portion 18 of the handle 12 provides a mount for the other components of the wafer grip 10. A cross bar 22 connected to a forwardly facing side of the base portion 18 is of a generally inverted U-shape, having arms 24 which project forwardly from the remainder of the cross bar (FIG. 3).

Stationary fingers 26 mounted on respective arms 24 of the cross bar 22 and extending further forward from the handle 12 are adapted to engage the wafer W for use in gripping the wafer. An extension 28 of the base portion 18 of the handle projecting upwardly from the remainder of the handle has an opening 30 through which is received a pivot 32 mounted by a pin 34 for swinging motion relative to the handle (FIG. 2). As shown in FIG. 3, a pivot finger 36 is mounted on the end of an extension of the pivot which includes a portion 38 projecting to the side of the wafer grip and a portion 40 projecting forward of the wafer grip. A compression spring 44 is connected at one end to the pivot 32 and at the other end to the handle 12 for urging the pivot and connected pivot finger 36 to swing in a counterclockwise direction (as shown in FIG. 1) on the pin 34, and against the peripheral edge E of the wafer W for gripping the wafer. The rear end of the pivot 32 is tapered and located adjacent the upper end of the grip portion 14 of the handle 12 where it may be conveniently depressed by the operator's thumb (not shown) to swing the pivot finger 36 in a clockwise direction against the bias of the spring 44 away from the wafer W for releasing the wafer from the grip 10.

The fingers 26, 36 are made of a heat resistant plastic, such as plastic sold under the tradename VESPEL by E. I. DuPont de Nemours and Company. The fingers 26, 36 are constructed and arranged for gripping the wafer W only at its peripheral, generally outwardly facing edge E, thereby virtually eliminating contact of the fingers with the faces F1, F2 of the wafer. Each of the fingers 26 has a notch 48 constructed for receiving a portion of the edge margin of the wafer W therein for gripping the wafer, as shown for one of the fingers in FIG. 5. At the lower end of the notch 48 is a retainer tab 50 which is of a length substantially less that the thickness of the finger 26. In the preferred embodiment, the pivot finger 36 has a notch substantially the same as the notch 48 shown for finger 26 in FIG. 5.

As shown in FIG. 1, the wafer grip 10 is operable to place the wafer W into a wafer compartment C in a susceptor S located in an expitaxial reaction chamber (not shown). It is to be understood that although the present invention has particular application to the handling of semiconductor wafers in the context of epitaxial layer deposition, it may be used for handling other materials in other applications and still fall within the scope of the present invention. The wafer compartment C is a generally circular recess in the susceptor S in which the wafer W is supported on a floor F of the compartment (FIG. 1A). More particularly, the wafer W engages the floor F generally along a lower portion of the peripheral edge E. Smaller, generally diamond-shaped recesses R located around the compartment C open into the compartment, permitting the fingers 26, 36 to be inserted inwardly past the edge E of the wafer W to be in position for gripping the wafer as it rests in the compartment, as is illustrated in FIG. 1. As disposed in the wafer compartment C, one face of the wafer (i.e., face F1) is directed outwardly of the compartment. An epitaxial layer is formed on face F1 by the deposition of semiconductor material from a chemical vapor which is circulated through the reaction chamber and over the susceptor S.

The wafer grip 10 further includes means indicated generally at 54 for suppressing splashing of particles onto the outwardly directed face F1 of the wafer W as it is set into and removed from the wafer compartment C. Particle generation is believed to occur primarily at or near the location where the wafer W contacts the floor F of the wafer compartment C. Thus, the means for deflecting the particles 54 is located near the lower portion of the peripheral edge E of the wafer when the wafer is held in the wafer grip 10. Particle generation can occur upon placement of the wafer W into the compartment C by inadvertently disintegrating a layer of the semiconductor material left on the floor F of the compartment from prior deposition processes when the lower portion of the edge E of the wafer impacts the floor. The generation of particles may also occur when the wafer W is removed from the compartment after epitaxial layer deposition by the breaking of material bridges formed by deposited semiconductor material and extending between the wafer and the floor F of the compartment C near the contact point.

The deflecting means 54 includes nozzles (each designated 56) for directing a flow of gas from a location generally radially inward of the lower portion of the peripheral edge E of the wafer W which engages the floor F of the wafer compartment C, outwardly toward the lower portion of the edge E and away from the outwardly directed face F1 of the wafer. The nozzles 56 are connected to a manifold 58 which is curved so that the nozzles lie generally along an arc. The nozzles 56 and manifold 58 constitute "orifice means" in the preferred embodiments. In an alternate preferred embodiment (i.e., wafer grip 10' shown in FIG. 4), the nozzles 56 are not present, and holes 60 in the manifold 58 are arranged for directing a flow of gas toward the lower edge of the wafer W.

In the preferred embodiments, the manifold 58 is joined by a conduit, generally indicated at 62, connected to a source of pressurized, inert gas. A first section 62A of the conduit includes a flexible portion and extends generally from the source of pressurized gas to a filter 64, and a second, rigid section 62B extends from the filter to the manifold 58. The conduit 62 is mounted by bracket 63 on the lower portion 18 of the handle 12. The filter 64 is adapted to remove impurities which might be entrained in the flow of gas so that the gas does not introduce particulate contaminants to the wafer W. The length of the flexible first section of conduit 62A is sufficient to permit the range of movement needed to transfer the wafers W to and from the susceptor S. Generally speaking, the greater the length of the conduit 62, the greater the likelihood of contaminants becoming entrained in the flow of gas. In the preferred embodiment, the filter 64 is a Waferguard F Mini In-Line gas filter, catalog number WGFG 01H S1, manufactured by Millipore Corporation of Bedford, Mass. The Millipore filter retains substantially all particles having a size greater than 0.05 microns. However, it is believed that the filter 64 could operate if it retained particles having a size of about 0.1 microns or greater.

The means 54 for deflecting particles away from the wafer W further includes a vacuum, indicated generally at 66, for collecting particles. As shown in FIG. 2, the vacuum 66 has an intake 68 located (with respect to the wafer W) radially outwardly of the nozzles 56 and the lower portion of the peripheral edge E of the wafer. The intake 68 includes an upper wall 68A, a lower wall 68B, a back wall 68C, opposite end walls 68D and an open front 68E. The lower wall 68B is wider than the upper wall 68A such that the front 68E of the intake opens in a direction angled upwardly toward the lower peripheral edge portion of the wafer W. The intake 68 is shaped so that its open front 68E is curved along an arc extending parallel to the lower peripheral edge of the wafer W. The open front 68E is placed so that particles entrained by the flow of gas from the nozzles 56 are directed generally toward the intake 68 for their removal. The intake 68 has a pair of ports 70 in the back wall 68C connected by way of a Y-shaped hose 72 (FIG. 3) to a vacuum source, each arm 74 of the Y-shaped hose being connected to a respective port. It is envisioned that the deflecting means 54 could be used to suppress particle splash in absence of the fingers 26, 36 or any other mechanism for gripping the wafer.

In operation, the wafer grip 10 is grasped in one hand by the grip portion 14 of the handle 12, and the operator depresses the rear end of the pivot 32 to swing the pivot finger 36 outwardly away from the stationary fingers 26 such that the fingers 26, 36 will admit a wafer W of predetermined diameter (e.g., 125 mm) between them. In the described operation, the wafer W is located at a position remote from the susceptor S, but it is to be understood that the "first location" of the wafer described in the claims can be either the wafer compartment C or a location remote from the wafer compartment and susceptor. The pivot 32 is carefully permitted to swing back under the urging of the spring 44 to bring the pivot finger 36 into engagement with the peripheral edge E of the wafer. The force of the spring 44 is sufficient to hold the wafer W in the notches 48 the three fingers 26, 36 while the wafer is transported to the epitaxial reaction chamber.

The wafer grip 10 and wafer W carried thereon are inserted into the reaction chamber and the wafer is placed in one of the wafer compartments C of the susceptor S, as shown in FIG. 1, with a lower portion of the peripheral edge E of the wafer engaging the floor F of the compartment (FIG. 1A). Although the walls of the susceptor appear to be vertical in FIGS. 1 and 1A, they are actually sloped with respect to the vertical V as indicated by line Z in FIG. 1. Thus, the wafers W are held in the compartments C by the force of gravity which urges the face F2 of the wafer against the back wall of the compartment C. At the same time the wafer W is placed in the compartment C, a flow of filtered, inert gas is directed from the nozzles 56 toward the lower portion of the peripheral edge E of the wafer. Particles generated by disintegration of deposited semiconductor material upon contact of the wafer W with the floor F may pop out onto the outwardly directed face F1 of the wafer or be drawn toward the outwardly directed face by the ascending flow of gas over the susceptor S and/or the attraction of a static electricity charge. However, these particles are deflected from the face F1 of the wafer by the flow of gas from the nozzles 56, and drawn away from the wafer by the vacuum 66.

It may be seen that the location of the intake 68 downstream from the nozzles 56 facilitates direction of particles entrained in the flow of air from the nozzles into the intake. In the preferred embodiments, the handle 12 and fingers 26, 36 orient the wafer W relative to the nozzles 56 (or openings 60) and intake 68 so that suppression of particle splashing is focused on the portion of the wafer where most particle generation is believed to occur. By removing the particles entirely from the area of the wafer W and, indeed, from the susceptor S and reaction chamber itself, greater cleanliness is maintained.

Several other wafers (not shown) are placed in respective compartments C of the susceptor S in the same fashion, and then the epitaxial deposition process is carried out in the reaction chamber in a way which is well known in the art. Subsequently, the reaction chamber is opened and the wafer grip 10 is inserted with the fingers 26, 36 entering the recesses R around the wafer compartment C and passing forwardly of the wafer to bring the notches 48 generally into registration with the peripheral edge E of the wafer. The pivot 32 is depressed to swing out the pivot finger 36 before the fingers 26, 36 enter the recesses R. Once in place, the pivot 32 is carefully released so that the pivot finger 36 and stationary fingers 26 bear against and grip the peripheral edge E of the wafer in their notches 48. A flow of gas from the nozzles 56 and vacuum suction into the intake 68 is maintained as the wafer W is removed. Bridges of semiconductor material (not shown) extending between the wafer W and the floor F of the wafer compartment C are broken as the wafer is removed from the compartment. Particles created by breaking the bridge are deflected from the wafer W and drawn away from the wafer into the intake by action of the flow of gas from the nozzles 56 and application of vacuum pressure through the intake 68.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A device for suppressing the splash of particles onto a semiconductor wafer to facilitate maintenance of a clean wafer surface and inhibit the creation of defects, the device comprising a mount, means attached to the mount for directing a flow of gas, said means for directing a flow of gas comprising a conduit for delivering pressurized gas and orifice means, means engageable with the wafer for orienting the wafer relative to said gas flow directing means, said orienting means being supported on the mount, said gas flow directing means being disposed relative to said orienting means such that, when the wafer is oriented relative to said gas flow directing means by said orienting means, said orifice means is spaced from the wafer and disposed inwardly of the periphery of the wafer within a cylindrical projection of the periphery of the wafer, and arranged for directing a flow of gas obliquely to the wafer and generally toward a peripheral edge portion of the wafer.

2. A device as set forth in claim 1 wherein the conduit of said means for directing a flow of gas is adapted for connection to a source of pressurized gas at one end of the conduit, said orifice means being located generally at another end of the conduit opposite said one end, the device further comprising a filter disposed intermediate the ends of the conduit for removing impurities entrained in the flow of pressurized gas.

3. A device as set forth in claim 2 wherein said orifice means comprises a manifold having a plurality of openings therein through which gas may be discharged toward said edge portion of the wafer, said manifold being constructed so that the openings lie generally along an arc parallel to the peripheral edge portion of the wafer.

4. A device as set forth in claim 3 wherein the manifold further comprises nozzles extending outwardly from the manifold, the manifold openings being located at the distal ends of the nozzles.

5. A device as set forth in claim 2 wherein the filter is adapted to remove substantially all particles from the gas in the conduit having a size of 0.1 microns or greater.

6. A device as set forth in claim 2 further comprising vacuum means for collecting the particles.

7. A device as set forth in claim 6 wherein said vacuum means comprises an intake located outward of said peripheral edge portion of the wafer.

8. A device as set forth in claim 7 wherein the intake is arranged generally along an arc extending parallel to the peripheral edge portion of the wafer and generally parallel to the arc along which the manifold openings are arranged.

9. A device as set forth in claim 6 wherein said means for orienting the wafer relative to said gas flow directing means comprises means for gripping the wafer to hold the wafer during transport thereof.

10. A device as set forth in claim 9 wherein said gripping means comprises fingers projecting outwardly therefrom, the fingers being spaced apart from each other and constructed for engaging the wafer generally at its periphery.

11. A device as set forth in claim 10 wherein at least one of the fingers is pivotally mounted on the device for movement between a grip position in which the finger is adapted to engage the periphery of the wafer for holding the wafer and a release position in which the finger is adapted to be spaced from the periphery for releasing the wafer from the device.

12. A device as set forth in claim 11 wherein the mount comprises a handle for manually lifting and moving the device and the wafer held by the fingers thereby to transport the wafer while suppressing particle deposition on the wafer.

13. A device as set forth in claim 12 further comprising means for biasing the pivotally mounted finger toward the grip position.

14. A device as set forth in claim 1 further comprising vacuum means for drawing particles away from the wafer.

15. A device as set forth in claim 14 wherein said vacuum means comprises an intake located outward of the peripheral edge portion of the wafer.

16. A device as set forth in claim 15 wherein the intake is arranged generally along an arc extending parallel to the peripheral edge portion of the wafer.

17. A portable device for transporting semiconductor wafers having opposing faces, the device suppressing the splash of particles onto one of the faces of the wafer to facilitate maintenance of a clean wafer face and inhibit the creation of defects, the device comprising a mount adapted for movement from one location to another location for transporting a wafer, a conduit attached to the mount for delivering pressurized gas, a manifold attached to the mount and in communication with the conduit, the manifold having a plurality of openings therein through which gas is discharged toward one of the wafer faces, fingers attached to the mount and projecting outwardly therefrom, the fingers being spaced apart from each other for selectively engaging the wafer generally at its periphery to hold the wafer and orient it relative to the manifold openings, and vacuum means for drawing particles away from the wafer, said vacuum means comprising a vacuum intake attached to the mount and disposed for receiving gas flowing from the manifold openings and particles entrained therewith.

18. A device as set forth in claim 17 wherein the vacuum intake is located generally radially outwardly of the peripheral edge portion of the wafer held by the device in a position to receive gas flowing from the manifold openings and particles entrained therewith.

19. A device as set forth in claim 18 wherein the mount comprises a handle constructed for manually gripping the device.

20. A device as set forth in claim 19 wherein the manifold openings are disposed relative to the fingers such that, when the wafer is held by the fingers, the manifold openings are spaced from the wafer and disposed inwardly of the peripheral edge of the wafer within a cylindrical projection of the peripheral edge of the wafer, and arranged for directing a flow of gas obliquely to the wafer and generally toward a peripheral edge portion of the wafer.

21. A device as set forth in claim 18 wherein the vacuum intake is arranged generally along an arc extending generally parallel to the peripheral edge portion of the wafer, and wherein the manifold is constructed such that the openings lie generally along an arc parallel to the peripheral edge portion and to the arc of the vacuum intake.

22. A device as set forth in claim 17 wherein at least one of the fingers is pivotally mounted on the device for movement between a grip position in which the finger is adapted to engage the periphery of the wafer for holding the wafer and a release position in which the finger is adapted to be spaced from the periphery for releasing the wafer from the device.

23. A method for removing a semiconductor wafer from a chemical vapor deposition chamber in which the wafer rests on a portion of its peripheral edge while suppressing particles from becoming deposited on a face of the wafer where they may become the site of a defect, the method comprising the steps of:

inserting a wafer transporting device into the chamber, the device having a manifold, a conduit communicating with the manifold, openings in the manifold and wafer gripping fingers;

gripping the wafer with the fingers;

directing a flow of gas from the openings in the manifold at a location spaced from the wafer and inward of the periphery of the wafer within a cylindrical projection of the peripheral edge of the wafer, the gas flow being directed obliquely to the wafer and generally toward the peripheral edge portion of the wafer on which it rests in the chamber;

capturing gas from the manifold and particles entrained in the gas by suction at a vacuum intake of the device located generally radially outwardly from the peripheral edge portion of the wafer;

removing the device and wafer gripped by the device from the chamber, thereby breaking material bridges between the wafer and the chamber formed by chemical vapor deposition and generating particles to be removed by the gas flow from the manifold and the vacuum intake.

24. A method for transporting a semiconductor wafer while suppressing particle deposition on a face of the wafer, the method comprising the steps of:

gripping the wafer at locations on the peripheral edge of the wafer;

directing a flow of gas toward a face of the wafer to deflect particles from the face and entrain them in the flow of gas;

at the same time as the step of directing the flow of gas, drawing off particles by application of a suction force adjacent to the face of the wafer;

moving the wafer from one location to another and at the same time continuing the steps of directing the flow of gas and drawing off particles.

25. A method as set forth in claim 24 wherein the step of directing a flow of gas comprises the step of directing the flow of gas toward a peripheral edge portion of the wafer where the most particle generation occurs.

* * * * *